United States Patent
Sewald (10) Patent No.: US 6,888,416 B2
(45) Date of Patent: May 3, 2005

(54) OSCILLATOR/MIXER CIRCUIT HAVING REDUCED AREA REQUIREMENT WHEN PRODUCED ON A CHIP

(75) Inventor: Dieter Sewald, Bruckmuhl (DE)

(73) Assignee: Infineon Technologies AG (DE)

(*) Notice: Subject to any disclaimer, the term of this patent is extended or adjusted under 35 U.S.C. 154(b) by 174 days.

(21) Appl. No.: 10/169,010
(22) PCT Filed: Dec. 19, 2000
(86) PCT No.: PCT/DE00/04523
§ 371 (c)(1),
(2), (4) Date: Sep. 17, 2002
(87) PCT Pub. No.: WO01/47101
PCT Pub. Date: Jun. 28, 2001

(65) Prior Publication Data
US 2004/0130403 A1 Jul. 8, 2004

(30) Foreign Application Priority Data
Dec. 20, 1999 (DE) .......................... 199 61 534

(51) Int. Cl.$^7$ ................................................ H03B 1/00
(52) U.S. Cl. ..................... 331/74; 331/108 C; 331/46; 455/313; 455/323
(58) Field of Search ............................. 331/108 C, 74, 331/46, 117 R, 177 V; 455/313, 323

(56) References Cited

U.S. PATENT DOCUMENTS

| 4,268,916 A | 5/1981 | Kusakabe |
| 5,166,645 A | 11/1992 | Watts |
| 5,418,500 A * | 5/1995 | Igarashi .................. 331/76 |

FOREIGN PATENT DOCUMENTS

| DE | 2523724 A1 | 12/1975 |
| DE | 3124492 C2 | 1/1983 |

* cited by examiner

Primary Examiner—Arnold Kinkead
(74) Attorney, Agent, or Firm—Jeffrey R. Stone; Altera Law Group, LLC (57) ABSTRACT

An oscillator/mixer circuit having a reduced area requirement when producing it on a chip and where the circuit's mixer circuit is not based on the use of the nonlinear characteristic curve of an active component. The preferred embodiment of the oscillator/mixer circuit comprises an oscillator circuit; a mixer circuit, wherein the oscillator and mixer circuits have the same components to some extent and wherein the mixer circuit has at least a first switch element and a second switch element. An output of the first switch element is coupled to a control input of the second switch element via a first feedback element. An output of the second switch element is coupled to a control input of the first switch element via a second feedback element. The feedback elements are set up allow oscillator operation of the oscillator/mixer circuit.

10 Claims, 4 Drawing Sheets

PRIOR ART

FIG 4

PRIOR ART

FIG 5

PRIOR ART

OSCILLATOR/MIXER CIRCUIT HAVING REDUCED AREA REQUIREMENT WHEN PRODUCED ON A CHIP

BACKGROUND OF THE INVENTION

1. Field of the Invention

The invention relates to an oscillator/mixer circuit.

2. Description of the Related Prior Art

Such an oscillator/mixer circuit for processing analog signals is known in the form of a series circuit for an oscillator circuit with a mixer circuit.

In analog circuit technology, a voltage-controlled oscillator is used for producing a signal of a frequency prescribed by setting the dimensions of the oscillator circuit. Using a mixer circuit, particularly a switching mixer, such as a Gilbert cell, a signal to be mixed is mixed with a local oscillator signal, as explained in more detail below, i.e. frequency conversion is performed for the signal which is to be mixed.

Both a voltage-controlled oscillator and a switching mixer in a microelectronic circuit are currently used in a large number of appliances and systems, for example for wireless radio transmission of information, such as in a mobile radio system, a GPS receiver and a television satellite receiver.

Figure 2:
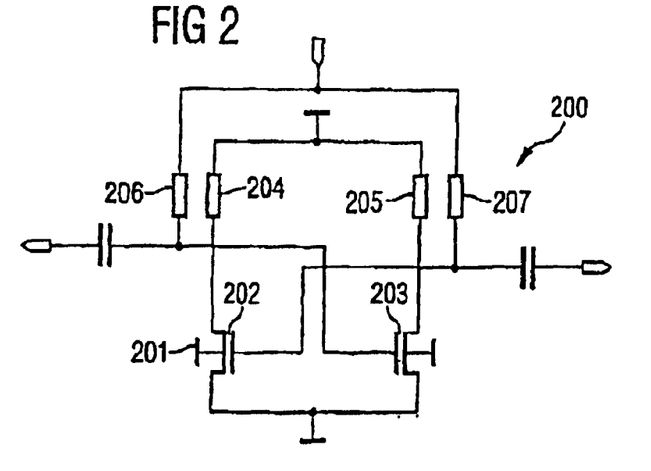
FIG. 2 shows a basic illustration of a radio-frequency oscillator.

FIG. 2 shows the basic design of a normal oscillator 200, as used in microelectronics.

The oscillator 200 has a differential multivibrator 201 having two MOS field-effect transistors 202, 203. In addition, the oscillator 200 shown in FIG. 2 has a resonator element 204, 205 and also at least one voltage-controlled tuning element 206, 207. The voltage-controlled tuning element 206, 207 is also simply called a tuning element.

Figure 3:
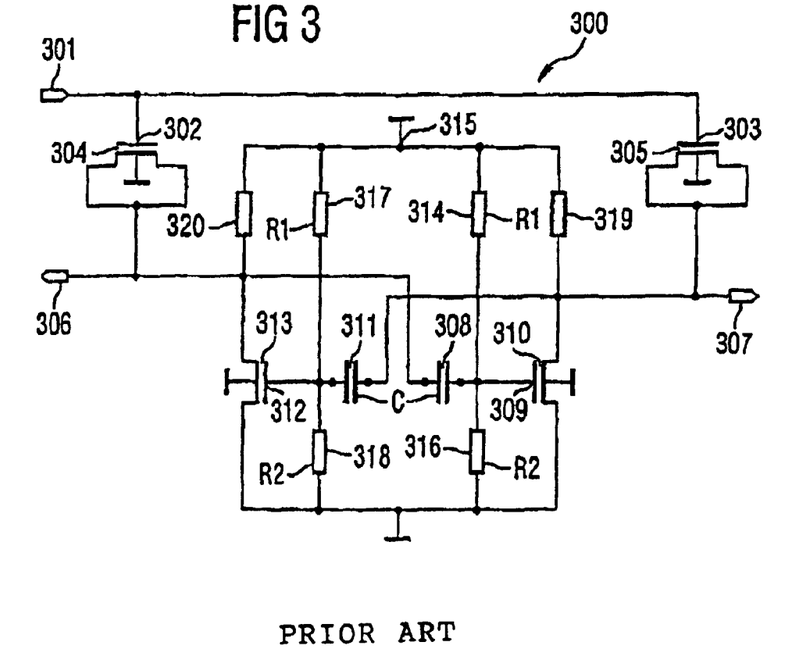
FIG. 3 shows an oscillator circuit according to the prior art.

FIG. 3 shows a basic circuit for an oscillator based on the prior art.

The oscillator 300 is in the form of an RC oscillator and has two MOS field-effect transistors 304, 305 coupled to an input 301 via their respective gate connection 302, 303. The source connection and the drain connection of the first MOS field-effect transistor 304 are connected together and are coupled to a first output 306. The drain connection and the source connection of the second MOS field-effect transistor 305 are likewise coupled to one another and to a second output 307 of the oscillator 300.

The first output 306 is coupled to the gate connection 309 of a third transistor 310 via a first capacitor C 308.

The second output 307 is coupled to the gate connection 312 of a fourth transistor 313 via a second capacitor C 311.

The gate connection 309 of the third transistor 310 is also coupled to the supply connection 315, to which the operating voltage $V_{DD}$ for the oscillator circuit 300 can be applied, via a first electrical resistor R1 314. In addition, the gate connection 309 of the third transistor 310 is coupled to the ground potential via a second electrical resistor R2 316, which allows the operating point of the oscillator circuit 300 to be set.

The gate connection 312 of the fourth transistor 313 is connected to the supply connection 315 via a third electrical resistor R1 317 and also likewise to the ground potential via a fourth electrical resistor 318.

In addition, the drain connection of the third transistor 310 is coupled to the supply connection 315 via a fifth electrical resistor 319, and the drain connection of the fourth transistor 313 is coupled to the supply connection 315 via a sixth electrical resistor 320. The fifth electrical resistor 319 and the sixth electrical resistor 320 are load resistors.

In addition, the source connections of the third transistor 310 and of the fourth transistor 313 are coupled to the ground potential.

Figure 4:
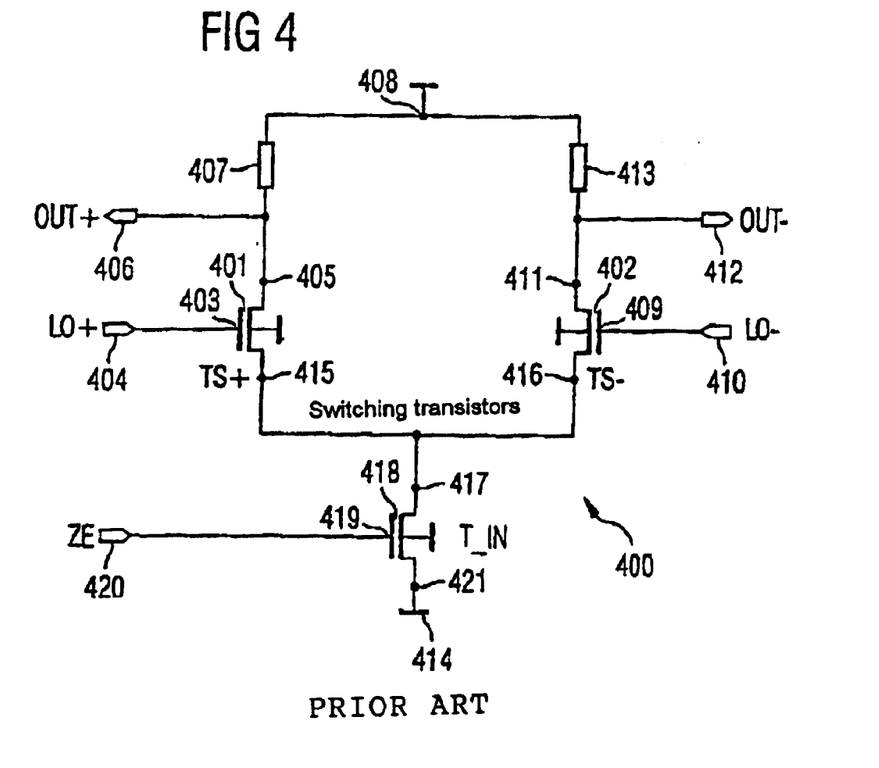
FIG. 4 shows a basic circuit for a Gilbert cell according to the prior art.

FIG. 4 shows the design of a normal Gilbert cell 400, which is an example of a switching mixer, i.e. of a mixer circuit which, as described below, has two transistors, in general terms two switch elements, which are each operated by virtue of the transistors being turned on and off. In addition, the normal Gilbert cell 400 has an analog input transistor.

The Gilbert cell 400 has a first switching transistor 401 and a second switching transistor 402.

The gate connection 403 of the first switching transistor is coupled to a first local oscillator input 404. The first local oscillator input 404 has a first local oscillator signal LO+ applied to it which is thus applied to the gate connection 403 of the first switching transistor 401, in order to control it by means of the local oscillator signal LO+, i.e. to turn it on and off.

The drain connection 405 of the first switching transistor 401 is coupled to a first output 406. In addition, the drain connection 405 of the first switching transistor 401 is coupled to a supply connection 408 via a first electrical resistor 407 as a mixer load resistor. The supply connection 408 can have the operating voltage $V_{DD}$ for operating the mixer circuit 400 applied to it.

Connected to the gate connection 409 of the second switching transistor 402 is a second local oscillator connection 410 to which a second local oscillator signal LO− can be applied for controlling the second switching transistor 402. The second local oscillator signal LO− is shifted through 180° with respect to the first local oscillator signal LO+.

The drain connection 411 of the second switching transistor 409 is coupled to a second output 412 and also to the supply connection 408 via a second electrical resistor 413 as a mixer load resistor.

The source connections 414, 415 of the first switching transistor 401 and of the second switching transistor 402 are coupled to the drain connection 417 of an analog input transistor 418. The gate connection 419 of the input transistor 418 is coupled to a mixing signal input 420 to which the analog input signal ZE to be mixed can be applied. The source connection 421 of the input transistor 418 is coupled to the ground potential.

In order to form an oscillator/mixer circuit from the known circuits described above, i.e. the oscillator circuit 300 and the mixer circuit 400, it is known practice to connect these circuits in series, i.e. a known oscillator/mixer circuit 500 (cf. FIG. 5) has the oscillator circuit 300 described in FIG. 3 and the mixer circuit 400 described in FIG. 4, which are connected to one another in series such that the first output 306 of the oscillator 300 is coupled to the first local oscillator input 404 of the mixer circuit 400 via a first electrical connection 501. The second output 307 of the oscillator circuit 300 is coupled to the second local oscillator input 410 of the mixer circuit 400 via a second electrical coupling 502. The local oscillator signals are shifted through 180° with respect to one another.

Figure 5:
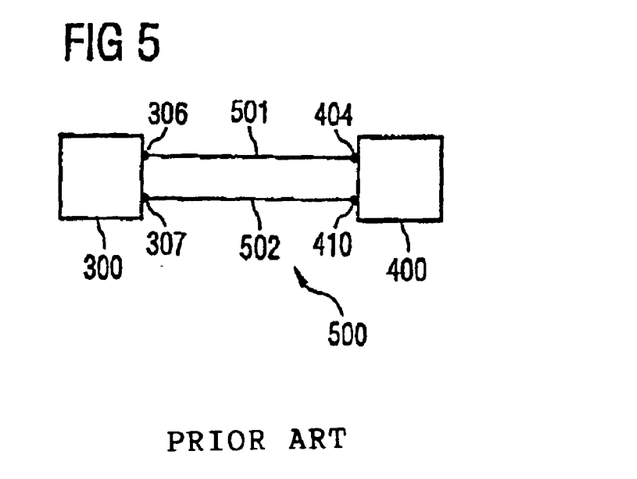
FIG. 5 shows an oscillator/mixer circuit according to the prior art.

The known oscillator/mixer circuit 500 has several drawbacks.

Connecting two complete, essentially mutually independent circuits, i.e. the oscillator circuit 300 and the mixer circuit 400, in series requires a relatively large number of electrical components, i.e. a relatively large number of electrical resistors and transistors, normally MOS field-effect transistors. Integration of the known oscillator/mixer circuit 500 on a chip thus has a considerable requirement in terms of chip area in order to implement it.

Another considerable drawback of the oscillator/mixer circuit 500 can be seen in that two electrical connections 501, 502 are required between the circuit components, i.e. the oscillator circuit 300 and the mixer circuit 400. Particularly in the area of very high-frequency applications, the electrical connections 501, 502 represent a considerable restriction in terms of their usability on account of the very high attenuation to which the output signal produced at the outputs 306, 307 of the oscillator circuit is subject before it reaches the inputs 404, 410 of the mixer circuit 400. In the case of a very high-frequency application in which a signal frequency in a range of approximately 1 GHz to several tens of GHz, preferably up to 77 GHz and above, is required, this results in such an oscillator/mixer circuit 500 barely being able to be used, since no signal with sufficient signal amplitude is applied to, i.e. arrives at, the local oscillator inputs 404, 410 of the mixer circuit 400.

In addition, particularly within the scope of implementing the oscillator/mixer circuit 500 as an integrated circuit, the "matching" problem is of great significance on account of the physical distances between the individual components of the circuit, since it is a considerable problem, technologically, to produce the components which are to be used with sufficient similarity over a relatively long distance from one another on a chip or on a wafer. This means that the components are frequently matched to one another only with great difficulty and sometimes not at all, resulting in an oscillator/mixer circuit 500 which works only poorly or not at all.

It is also known practice to use a diode or an electrical circuit containing a diode as a mixer circuit or as an oscillator circuit, where, in such a case in which a mixer circuit's mixing is based on an active component, mixing of the signals which are to be mixed is based on the nonlinear characteristic curve of an active component, in the specific case of the diode.

The invention is thus based on the problem of specifying an oscillator/mixer circuit which has a reduced area requirement, when producing it on a chip, as compared with the known oscillator/mixer circuit and where the oscillator/mixer circuit's mixer circuit is not based on the use of the nonlinear characteristic curve of an active component.

The problem is solved by the oscillator/mixer circuit having the features of the independent patent claim.

The oscillator/mixer circuit has an oscillator circuit and a mixer circuit. The oscillator circuit and the mixer circuit have the same components to some extent.

Expressed in other words, this means that the same components in the oscillator/mixer circuit are used both for frequency generation and for the mixing operation.

In addition, the mixer circuit has at least a first switch element and a second switch element, where an output of the first switch element is coupled to a control input of the second switch element via a first feedback element. An output of the second switch element is coupled to a control input of the first switch element via a second feedback element. The feedback elements are set up such that oscillator operation of the oscillator/mixer circuit is made possible.

Oscillator operation of the oscillator/mixer circuit is ensured, by way of example, by virtue of oscillation buildup being ensured in the oscillator circuit in the oscillator/mixer circuit, which can be achieved, by way of example, by virtue of the feedback elements ensuring that the control signals applied to the control inputs of the switch elements are certain to have a phase angle which is suitable for the oscillator circuit's respective circuit type, and also a loop gain of greater than 1.

Expressed clearly, this means that the oscillator/mixer circuit has an oscillator circuit and a mixer circuit which have common components and where the mixer elements are in the form of a switching mixer, i.e. in the form of a circuit which normally has at least two transistors operated in turn-on mode and turn-off mode.

This ensures that the mixing of signals in the oscillator/mixer circuit is not based on a nonlinear characteristic curve of an active component.

The oscillator circuit can also be set up as an LC oscillator circuit.

In this case, in one refinement of the invention, a respective inductor is coupled to the output of the first switch element and to the output of the second switch element, and the input of the first switch element is coupled to the input of the second switch element and to a mixing signal input to which a signal to be mixed can be applied.

Clearly, the oscillator/mixer circuit can thus be regarded as an oscillator circuit in which the ground connection and the source connections of the oscillator transistors in the oscillator circuit have an input transistor connected between them whose gate connection is coupled to the mixing signal input. In general terms, the drain connections of the oscillator transistors and the ground connection have an input transistor connected between them whose control input is coupled to the mixing signal input.

Thus, an oscillator/mixer circuit has been provided which has a significantly reduced number of required components and can simultaneously be operated as an oscillator circuit and as a mixer circuit.

The compact design and the, to some extent, common use of some components both by the oscillator circuit and by the mixer circuit in the oscillator/mixer circuit result in a significant reduction in required chip area for integrating the oscillator/mixer circuit.

In addition, the compact design of the oscillator/mixer circuit means that it is very well suited to a radio-frequency application, in particular, since the signals to be processed need to cover significantly reduced distances over electrical lines as compared with the known oscillator/mixer circuit described above, and are thus subject to significantly reduced attenuation.

In addition, the matching problem for the components used is avoided.

In one refinement of the invention, an analog input transistor is connected between the inputs of the switch elements and the mixing signal input, with the mixing signal input being coupled to the control input of the input transistor.

BRIEF SUMMARY OF THE INVENTION

In accordance with an alternative refinement of the invention, provision is also made for the oscillator circuit to be in the form of an RC oscillator circuit.

In this refinement, there is also a first electrical resistor which is connected between the control input of the first switch element and a supply connection, to which supply connection an operating voltage $V_{DD}$ for the oscillator/mixer circuit can be applied. A second electrical resistor is connected between the control input of the first switch element and the input of the first switch element, and a third electrical resistor is connected between the control input of the second switch element and the supply connection. A fourth electrical resistor is connected between the control input of the second switch element and the input of the second switch element. In addition, in this refinement of the invention, the input of the first switch element is coupled to the input of the second switch element and also to a mixing signal input to which a signal which is to be mixed can be applied.

In accordance with this refinement of the invention, provision is preferably made for the first electrical resistor and the third electrical resistor to be dimensioned in the same way, and for the second electrical resistor and the fourth electrical resistor to be given the same dimensions.

A further switch element can be connected between the inputs of the switch elements and the mixing signal input, with the mixing signal input being coupled to a control input of the input transistor.

In another refinement of the invention, the feedback elements are set up such that the phase angle of the signals applied to the respective control input can be set.

In addition, the feedback elements can be set up as frequency-determining elements of the oscillator/mixer circuit.

Within the context of this description, the expression "frequency-determining element" is to be understood to mean that such an element can be used to set the oscillation frequency of the oscillator circuit.

The first feedback element and the second feedback element can each have a capacitor, preferably a capacitor whose capacitance can be respectively varied, preferably using a control voltage.

The first switch elements and/or the second switch element can each have a transistor or can be formed by a transistor.

In another refinement of the invention, at least some of the components are produced using CMOS technology.

Exemplary embodiments of the invention are illustrated in the figures and are explained in more detail below.

DETAILED DESCRIPTION OF THE INVENTION

Figure 1:
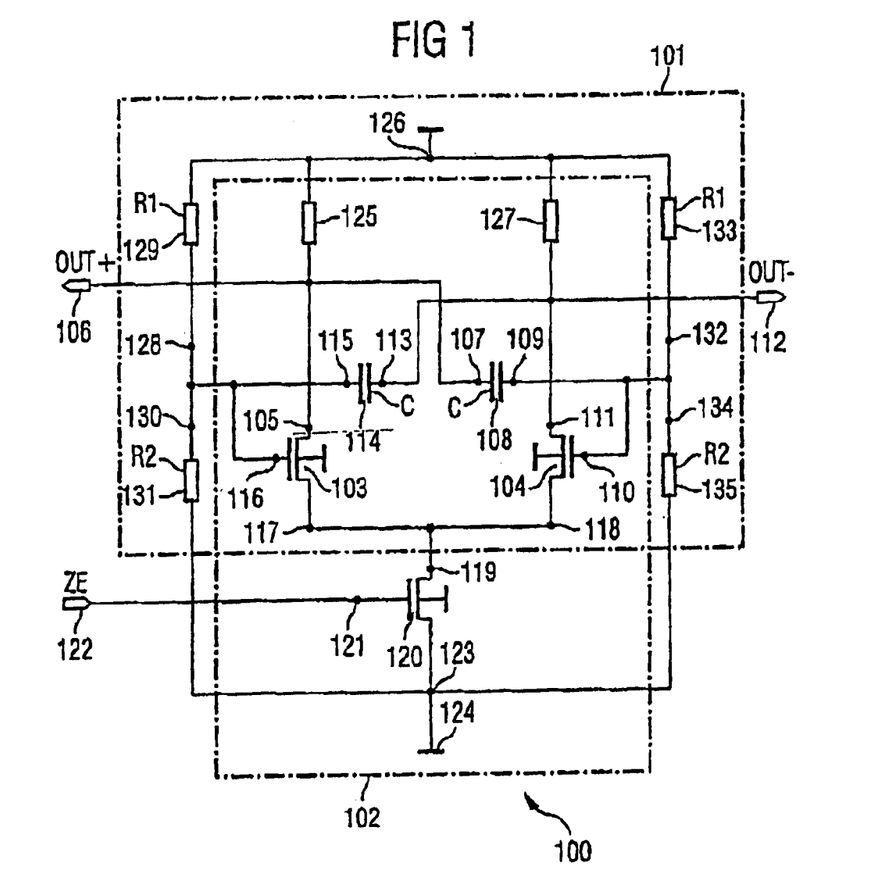
FIG. 1 shows an oscillator/mixer circuit according to a first exemplary embodiment of the invention.

FIG. 1 shows an oscillator/mixer circuit 100 according to a first exemplary embodiment of the invention.

The oscillator/mixer circuit 100 has an oscillator circuit 101 (symbolized using dashed lines in FIG. 1) and a mixer circuit 102 (symbolized using dashes and dots in FIG. 1).

As FIG. 1 shows, some components in the oscillator/mixer circuit 100 are contained both in the oscillator circuit 101 and in the mixer circuit 102.

The oscillator/mixer circuit 100 has a first switching transistor 103 and a second switching transistor 104.

The drain connection 105 of the first switching transistor 103 is coupled to a first output 106 of the oscillator/mixer circuit 100. When the oscillator/mixer circuit 100 is in mixing mode, the first output 106 provides a first output signal OUT+, which is also referred to as a first intermediate frequency signal OUT+ in downward mixing mode.

In addition, the first output 106 and the drain connection 105 of the first switching transistor 103, as switch output for the first switch element, are coupled to a first connection 107 of a first capacitor 108 as a first feedback element. A second connection 109 of the first capacitor 108 is coupled to the gate connection 110 of the second switching transistor 104.

The drain connection 111 of the second switching transistor 104, as switch output for the second switch element, is coupled to a second output 112 of the oscillator/mixer circuit 100. When the oscillator/mixer circuit 100 is in mixer mode, the second output 112 provides a second output signal, which is also referred to as second intermediate frequency signal OUT− in downward mixing mode.

The phase angle of the second output signal is shifted through 180° with respect to that of the first output signal.

In addition, the drain connection 111 of the second switching transistor 104 is coupled to a first connection 113 of a second capacitor 114 as a second feedback element. A second connection 115 of the second capacitor 114 is coupled to the gate connection 116 of the first switching transistor 103.

The source connection 117 of the first switching transistor 103, as switch input for the first switch element, is coupled to the source connection 118 of the second switching transistor 104, as switch input for the second switch element, and also to the drain connection 119 of an input transistor 120, which is no longer a functional element of the oscillator circuit 101, but is a functional element of the mixer circuit 102.

The gate connection 121 of the input transistor 120 is coupled to a mixing signal input 122 to which a normally analog input signal ZE which is to be mixed can be applied.

The source connection 123 of the input transistor 120 is coupled to the ground connection 124.

Expressed another way, this means that the drain connections, i.e. clearly the outputs of the two switching transistors 103, 104, are fed back crosswise via a respective capacitor 108 or 114 to the gate connections 110, 116 of the respective other switching transistor 103, 104.

This clearly means that the mixer circuit 102, in comparison with the mixer circuit according to the prior art, which has a diode as mixing element, inventively uses a switching mixer which involves the respective switching transistors 103, 104 respectively turning one another on and off in antiphase.

Expressed another way, this means that, if the first switching transistor 103 is on, the second switching transistor 104 is in a deactivated state on account of the feedback via the first capacitor 108 to the gate connection 110 of the second switching transistor 104. If the second switching transistor 104 is in an activated state, the first switching transistor 103 is in a deactivated state on account of the feedback via the second capacitor 114 to the gate connection 116 of the first switching transistor.

The drain connection 105 of the first switching transistor 103 is also coupled to a supply connection 126, to which the operating voltage $V_{DD}$ for the oscillator/mixer circuit 100 can be applied, via a first electrical resistor 125.

The supply connection 126 likewise has the drain connection 111 of the second switching transistor 104 coupled to it via a second electrical resistor 127.

In addition, the gate connection 116 of the first switching transistor and the second connection 115 of the second capacitor 114 are coupled to a first connection 128 of a third electrical resistor 129 and via the latter to the supply connection 126.

In addition, the gate connection 116 of the first switching transistor and the second connection 115 of the second capacitor 114 are coupled to the ground connection 124 via a first connection 130 of a fourth electrical resistor 131 and via the latter.

The gate connection 110 of the second switching transistor 104 and the second connection 109 of the first capacitor 108 are coupled to a first connection 132 of a fifth electrical resistor 133 and via the latter to the supply connection 126.

In addition, the gate connection 110 of the second switching transistor 104 and the second connection 109 of the first capacitor 108 are coupled to a first connection 134 of a sixth electrical resistor 135 and via the latter to the ground connection 124.

Figure 6:
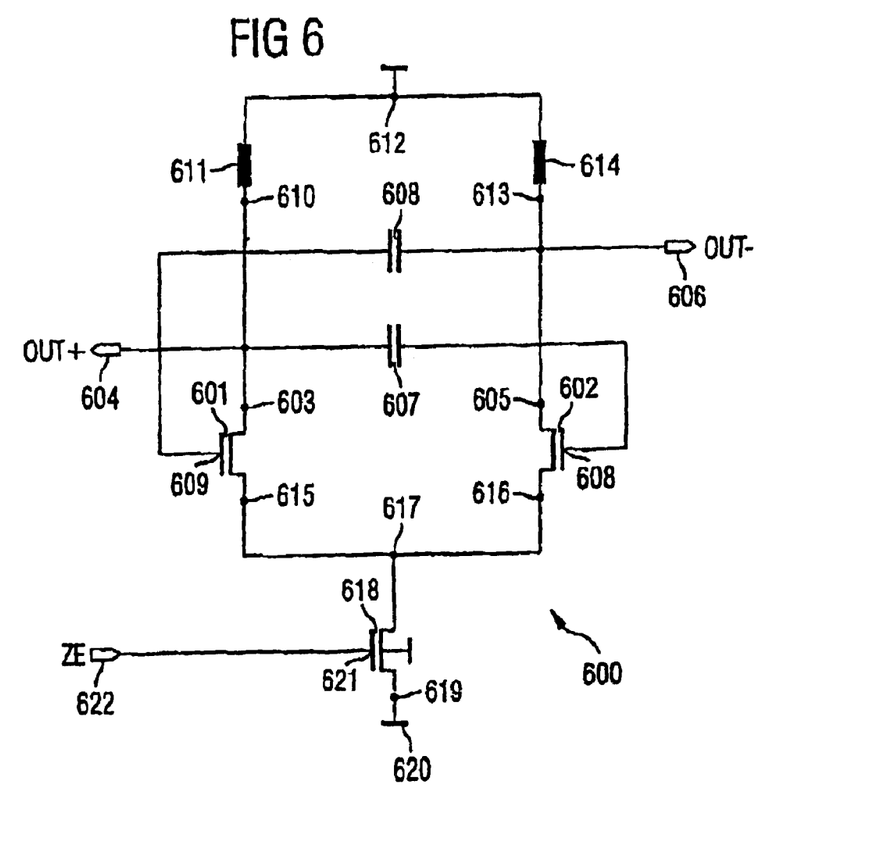
FIG. 6 shows an oscillator/mixer circuit according to a second exemplary embodiment of the invention.

FIG. 6 shows an oscillator/mixer circuit 600 according to a second exemplary embodiment of the invention.

In accordance with the second exemplary embodiment of the invention, the oscillator circuit is set up as an LC oscillator circuit.

The oscillator/mixer circuit 600 has a first switching transistor 601 and a second switching transistor 602.

The drain connection 603 of the first switching transistor 601 is coupled to a first output 604 of the oscillator/mixer circuit 600, and the drain connection 605 of the second switching transistor 602 is coupled to a second output 606 of the oscillator/mixer circuit 600.

In addition, the drain connection 603 of the first switching transistor 601 is coupled to the gate connection 608 of the second switching transistor 602 via a first capacitor 607 as a first feedback element, and the drain connection 605 of the second switching transistor 602 is coupled to the gate connection 609 of the first switching transistor 601 via a second capacitor 608 as a second feedback element.

This again achieves crosswise feedback of the respective outputs of the switching transistors, as switch elements of the oscillator/mixer circuit 600, to the respective control inputs, i.e. the gate connections of the respective other switching transistor.

In addition, the drain connection 603 of the first switching transistor 601 is coupled to a first connection 610 of a first inductor 611 and via the latter to a supply connection 612 of the oscillator/mixer circuit 600.

The drain connection 605 of the second switching transistor 602 is additionally coupled to a first connection 613 of a second inductor 614 and via the latter likewise to the supply connection 612.

In addition, the source connection 615 of the first switching transistor 601 and the source connection 616 of the second switching transistor 602 are coupled to one another and to a drain connection 617 of an input transistor 618, whose source connection 619 is coupled to the ground connection 620.

The source connection 621 of the input transistor 619 is coupled to a mixing signal input 622 of the oscillator/mixer circuit 600.

The capacitors for the feedback elements described above both in the oscillator/mixer circuit 100 based on the first exemplary embodiment and in the oscillator/mixer circuit 600 based on the second exemplary embodiment are set up such that a respective phase shift of 180° is ensured for the respective electrical analog signals applied to the gate connections of the switching transistors.

Figure 7:
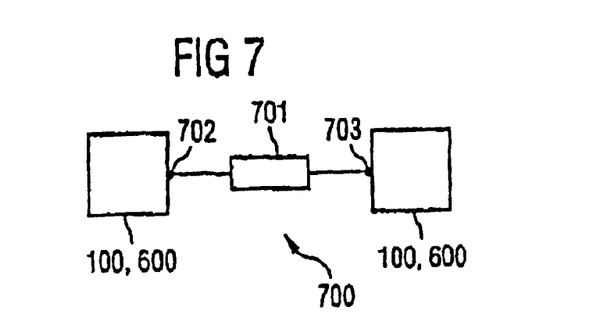
FIG. 7 shows an oscillator/mixer circuit according to a third exemplary embodiment of the invention.

FIG. 7 shows, as a third exemplary embodiment, two series-connected mixer/oscillator circuits according to the first exemplary embodiment or according to the second exemplary embodiment, which are coupled to each other via a phase shifter element 701 which is set up such that the phase of an output signal 702 produced at an output of the first oscillator/mixer circuit is shifted through 90° with respect to the input signal 703 applied to the input of the second oscillator/mixer circuit.

In this way, an oscillator/mixer circuit 700 providing a total of four output signals is specified whose output signals are each shifted through 90° with respect to one another.

In the two exemplary embodiments described above, the components are produced using CMOS technology, i.e. the transistors used, in particular, are CMOS field-effect transistors.

The implementations described above thus mean that the mixer circuit and the oscillator circuit are clearly no longer circuits which are physically separate from one another; instead, the same components are largely used both for the mixer circuit and for the oscillator circuit.

Hence, if component tolerances are produced in the oscillator/mixer circuit, these affect both the operation of the mixer circuit and that of the oscillator circuit in the same way, and the mixer circuit and the oscillator circuit thus remain ideally matched to one another.

On account of the saving on the connecting lines, required in an oscillator/mixer circuit according to the prior art, between the oscillator circuit and the mixer circuit (cf. FIG. 5, connecting lines 501, 502), the inventive oscillator/mixer circuit is particularly suitable for use in very high-frequency technology, particularly as a transmitter and/or receiver. A suitable frequency range for operating the inventive oscillator/mixer circuit is preferably in the order of magnitude of one to several 10 GHz, which means that the oscillator/mixer circuit can be used suitably for wireless radio transmission, for example as a mobile radio transmitter or mobile radio receiver, as a radar transmitter or radar receiver or as a receiver for a global positioning system (GPS).

The invention can clearly be seen as being that an oscillator circuit unit and a mixer circuit unit have, to some extent, the same components in order to perform their respective function. The mixer circuit has at least two switch elements. The latter's outputs are is respectively coupled crosswise to the control inputs of the respective other switch element via a respective feedback element. The feedback element is respectively set up such that oscillator operation of the oscillator/mixer circuit is additionally made possible.

It should be noted in this context that the oscillator/mixer circuit can be set up as an upward mixer or else as a downward mixer.

What is claimed is:

1. An oscillator/mixer circuit comprising:

an oscillator circuit, and a switching mixer circuit, in which the oscillator circuit and the switching mixer circuit have the same components to some extent, in which the switching mixer circuit has at least a first switch element having an input, an output and a control input, a second switch element having an input, an output and a control input and a third switch element having an output and a control in input, where the output of the first switch element is coupled to the control input of the second switch element via a first feedback element, where the output of the second switch element is coupled to the control input of the first switch element via a second feedback element, where the feedback elements are set up such that the oscillator operation of the oscillator/mixer circuit is made possible, where the control input of the third switch element is connected to a mixing signal input, to which a signal to be mixed can be applied, where the output of the third switch element is connected to the input of the first switch element and the input of the second switch element.

2. The oscillator/mixer circuit as claimed in claim 1, in which the oscillator circuit is set up as an LC oscillator circuit.

3. The oscillator/mixer circuit as claimed in claim 2, in which a respective inductor is coupled to the output of the first switch element and to the output of the second switch element, and in which the input of the first switch element is coupled to the input of the second switch element and to a mixing signal input to which a signal to be mixed can be applied.

4. The oscillator/mixer circuit as claimed in claim 1, in which the oscillator circuit is set up as an RC oscillator circuit.

5. The oscillator/mixer circuit as claimed in claim 4, further comprising:

a first electrical resistor, which is connected between the control input of the first switch element and a supply connection to which an operating voltage for the oscillator/mixer circuit can be applied;

a second electrical resistor, which is connected between the control input of the first switch element and the input of the first switch element;

a third electrical resistor, which is connected between the control input of the second switch element and the supply connection;

a fourth electrical resistor, which is connected between the control input of the second switch element and the input of the second switch element; and in which the input of the first switch element is coupled to the input of the second switch element and also to a mixing signal input to which a signal to be mixed can be applied.

6. The oscillator/mixer circuit as claimed in claim 1, in which the feedback elements are set up such that the phase angle of the signals applied to the respective control inputs can be set.

7. The oscillator/mixer circuit as claimed in claim 1, in which the feedback elements are set up as frequency-determining elements.

8. The oscillator/mixer circuit as claimed in claim 1, in which the first feedback element and the second feedback element have a capacitor.

9. The oscillator/mixer circuit as claimed in claim 1, in which the first switch element has a transistor, and in which the second switch element has a further transistor.

10. The oscillator/mixer circuit as claimed in claim 1, in which at least some of the components are produced using CMOS technology.

* * * * *

UNITED STATES PATENT AND TRADEMARK OFFICE
CERTIFICATE OF CORRECTION

PATENT NO. : 6,888,416 B2  Page 1 of 1
DATED : May 3, 2005
INVENTOR(S) : Dieter Sewald It is certified that error appears in the above-identified patent and that said Letters Patent is hereby corrected as shown below:

<u>Title page,</u>
Item [75], Inventors, change "Bruckmuhl (DE)" to -- Switzerland Au/SG --.

Signed and Sealed this

Fourteenth Day of March, 2006

JON W. DUDAS
*Director of the United States Patent and Trademark Office*